(12) United States Patent
Shin et al.

(10) Patent No.: US 6,495,467 B2
(45) Date of Patent: Dec. 17, 2002

(54) METHOD OF FABRICATING A NON-VOLATILE MEMORY DEVICE

(75) Inventors: Kwang-Shik Shin, Seoul (KR); Hee-Hong Yang, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/994,349

(22) Filed: Nov. 26, 2001

(65) Prior Publication Data
US 2002/0115255 A1 Aug. 22, 2002

(30) Foreign Application Priority Data
Feb. 19, 2001 (KR) .............................. 01-08131

(51) Int. Cl.$^7$ ............................ H01L 21/461
(52) U.S. Cl. .................. 438/706; 438/723; 438/724; 257/315; 257/314
(58) Field of Search .............. 438/257–265, 438/706, 723, 724; 257/315, 314, 316

(56) References Cited

U.S. PATENT DOCUMENTS 6,118,147 A * 9/2000 Liu .............................. 257/314
6,342,451 B1 * 1/2002 Ahn .............................. 438/706

* cited by examiner

Primary Examiner—David Nelms
Assistant Examiner—Dung Anh Le
(74) Attorney, Agent, or Firm—Mills & Onello, LLP

(57) ABSTRACT

A method of fabricating a non-volatile memory device having a U-shaped floating gate is described. This method forms a device isolation layer in a predetermined region of a semiconductor substrate, thereby defining at least one active region. A floating gate pattern covering active regions and having a gap region exposing the device isolation layer therebetween is formed, and an insulation material pattern where the width of a projection is wider than an upper width of the gap region while the projection covers the gap region and is higher then an upper surface of the floating gate pattern is formed. Subsequently, the floating gate pattern is etched using the insulation material pattern, thereby forming a modified floating gate pattern showing a U-shaped cross section on an active region. As a result, a coupling ratio of the non-volatile memory device can be increased.

35 Claims, 9 Drawing Sheets

METHOD OF FABRICATING A NON-VOLATILE MEMORY DEVICE

This application relies for priority upon Korean Patent Application No. 2001-08131, filed on Feb. 19, 2001, the contents of which are herein incorporated by reference in their entirety.

FIELD OF THE INVENTION

The present invention relates to a method of fabricating a semiconductor device, and more particularly to a method of fabricating a non-volatile memory device having a floating gate.

BACKGROUND OF THE INVENTION

Non-volatile memory devices can retain their previous data even though their power supplies are interrupted. Non-volatile memory devices include EPROMs capable of being electrically programmed and erased through the irradiation of a UV light and EEPROMs capable of being electrically programmed and erased. Flash memories have a small chip size and excellent program and erase characteristics in the EEPROM.

The non-volatile memory device typically includes a floating gate capable of accumulating electric charges in a general MOS transistor structure. A thin gate oxide layer called a tunnel oxide layer is interposed on a semiconductor substrate to form a floating gate. A gate interlayer dielectric layer is interposed on an upper portion of the floating gate to form a control gate electrode. Therefore, the floating gate is electrically insulated from the semiconductor substrate and the control gate electrode by the tunnel oxide layer and the gate interlayer dielectric layer.

The above-stated data program method of a non-volatile memory device includes a method using Fowler-Nordheim (FN) tunneling or a method using hot electron injection. In the method using FN tunneling, a high voltage is applied to a control gate electrode of the non-volatile memory to apply a high electric field to a tunnel oxide layer, and electrons of a semiconductor substrate pass the tunnel oxide layer and are injected into a floating gate by the high electric field. In the method of hot electron injection, a high voltage is applied to a control gate electrode and a drain region of a non-volatile memory to inject a hot electron generated near the drain region to a floating gate through a tunnel oxide layer. Therefore, a high electric field should be applied to the tunnel oxide layer in both FN tunneling and hot electron injection. In this case, a high coupling ratio is required in order to apply a high electric field to the tunnel oxide layer. The coupling ratio($C_R$) is shown in the following formula.

$$C_R = C_{ono}/C_{tun} + C_{ono} \quad \text{[formula 1]}$$

In this case $C_{ono}$ indicates capacitance between a control gate electrode and a floating gate, $C_{tun}$ indicates capacitance applied to the tunnel oxide layer interposed between the floating gate and the semiconductor substrate. Therefore, the surface area of the floating gate overlapped with the control gate electrode should be increased in order to increase the coupling ratio($C_R$). However, when increasing the surface area of the floating gate, it is difficult to increase the integration degree of a non-volatile memory device.

SUMMARY OF THE INVENTION

It is therefore an object of the present invention to provide a method of fabricating a non-volatile memory device having a floating gate, which can increase an integration degree of the device and obtain high capacitance of a gate interlayer dielectric layer.

These and other objects, advantages and features of the present invention may be provided by a method of fabricating a non-volatile memory device, where a floating gate has a U-shape thereby widening a size of a gate interlayer dielectric layer between the floating gate and a control gate electrode.

According to one aspect of the present invention, a method of forming a non-volatile memory device includes forming a device isolation layer in a predetermined region of a semiconductor substrate, thereby defining at least one active region. A floating gate pattern covering the active regions and having a gap region exposing the device isolation layer between the active regions is formed. An insulation material pattern where the width of a projection is wider than an upper width of the gap region while the projection covers the gap region and is higher than an upper surface of the floating gate pattern is formed. The floating gate pattern is etched using the insulation material pattern as etching mask, thereby forming a modified floating gate pattern having a U-shaped cross section on an active region. The insulation material pattern is removed, and a gate interlayer dielectric layer and a control gate electrode layer are sequentially formed on a surface of the semiconductor substrate where the insulation material pattern is removed.

It is preferable that the floating gate pattern be formed with a lower floating gate pattern, formed by interposing a tunnel oxide layer on the active regions simultaneously forming the device isolation layer, and an upper floating gate pattern, deposited on an upper portion of the lower floating gate pattern.

In one embodiment, the method of forming the floating gate pattern includes forming a tunnel oxide layer, a lower floating gate layer and a CMP stopping layer on a semiconductor substrate. The CMP stopping layer, lower floating gate layer, tunnel oxide layer and semiconductor substrate are sequentially patterned, thereby forming a trench region and defining at least one active region. A device isolation layer filling the trench region is formed, then the CMP stopping layer is removed, thereby forming a device isolation layer filling the trench region and a lower floating gate pattern interposing a tunnel oxide layer on the active regions. An upper floating gate layer and a sacrificial insulation layer are sequentially formed on an entire surface of a semiconductor substrate where the floating gate pattern is formed. The sacrificial insulation layer and the floating gate layer are patterns, thereby forming a sacrificial insulation layer pattern and an upper floating gate pattern sequentially deposited by having a gap region covering the active regions and exposing the device isolation layer between the active regions. As a result, a floating gate pattern comprising the lower floating gate pattern and the upper floating gate pattern is formed on the active regions.

It is preferable that the insulation material pattern form a projection wider than the gap region by flowing a photosensitive layer filling the gap region between the floating gate pattern or forming a polymer material layer formed in a sidewall or an upper portion of the photosensitive layer. It is also preferable that the insulation material pattern be formed with an oxide layer having a spacer.

In one embodiment, the method of forming the insulation material pattern includes forming a photosensitive layer filling the gap region on a surface of the resultant structure where the floating gate pattern and the sacrificial insulation layer pattern are formed. An upper portion of the photosensitive layer is removed, thereby exposing an upper portion of the sacrificial insulation layer pattern and simultaneously forming a photosensitive pattern inside the gap region. The sacrificial insulation layer pattern is removed, thereby exposing the floating gate pattern on the active regions and forming the photosensitive pattern having a projection higher than an upper portion of the floating gate pattern. Lastly, the photosensitive layer pattern is flowed thereby forming a modified photosensitive layer pattern covering an edge of the floating gate pattern. In another method, a polymer material layer is formed on an upper portion and sidewall of the projection of the photosensitive layer pattern, thereby forming a modified photosensitive pattern covering an edge of the floating gate pattern.

Another method of forming the insulation material pattern includes forming an oxide layer filling the gap region on a surface of a semiconductor substrate where the floating gate pattern and the sacrificial insulation layer pattern are formed. The oxide layer is etched using an etching method, thereby exposing an upper portion of the sacrificial insulation layer pattern, and simultaneously forming an oxide layer pattern inside the gap region. The sacrificial insulation layer pattern is removed, thereby exposing the floating gate pattern on the active regions and forming the oxide layer pattern having a projection higher than an upper surface of the floating gate pattern on the device isolation layer. Then, a spacer is formed in a sidewall of the oxide layer pattern.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
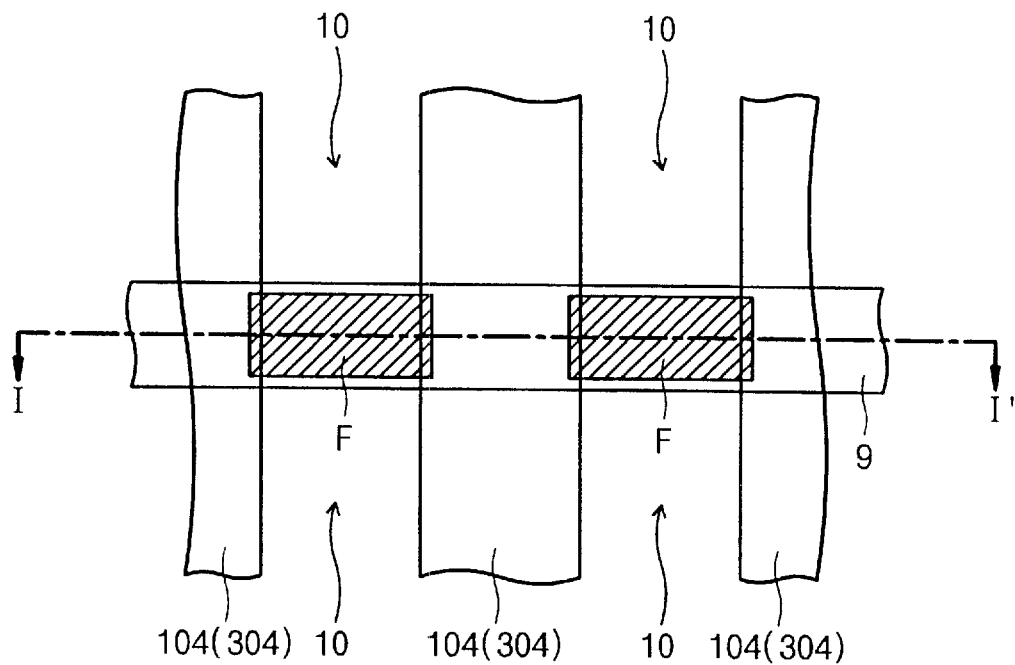
FIG. 1 is a top plan view schematically illustrating a method of a general non-volatile memory device.

The present invention will now be described more fully hereinafter with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate or intervening layers may also be present. Moreover, each embodiment described and illustrated herein includes its complementary conductivity type embodiments as well.

FIG. 1 is a top plan view schematically illustrating a method of a general non-volatile memory device. Referring to FIG. 1, device isolation layers 103,304 are formed on a semiconductor substrate, thereby defining at least one active region 10. A floating gate F is formed on an upper portion of the active region 10, thereby forming a control gate electrode 9 crossing the active region 10. A gate interlayer dielectric layer (not shown) is interposed between the floating gate F and the control gate electrode 9, and a tunnel oxide layer (not shown) is interposed between the floating gate F and the active region 10.

FIGS. 2 through 10 are process sectional views for illustrating a method of forming a non-volatile memory device according to a first embodiment of the present invention, taken along line I–I' of FIG. 1.

Figure 2:
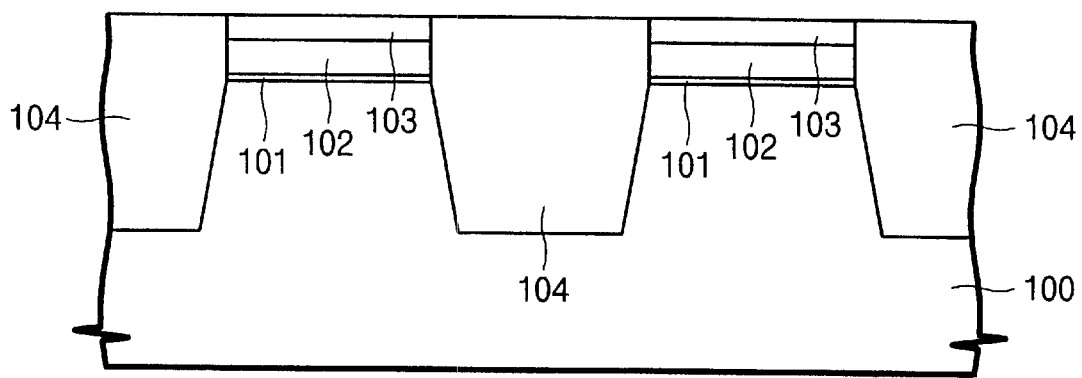
FIGS. 2 through 10 are process sectional views illustrating a method of forming a non-volatile memory device according to a first embodiment of the present invention, taken along line I–I' of FIG. 1.

Referring to FIG. 2, a tunnel oxide layer 101, a lower floating gate layer 102 and CMP stopping layer 103 are sequentially formed on a semiconductor substrate 100. It is desirable that the tunnel oxide layer is formed with a thermal oxide layer of a thickness of 40–100 angstrom. It is also desirable that the CMP stopping layer 103 is formed with a silicon nitride layer and the lower floating gate layer 102 is formed with a doped polysilicon layer or non-doped polysilicon layer.

The CMP stopping layer 103, the lower floating gate layer 102, the tunnel oxide layer and the semiconductor substrate 100 are continuously patterned, thereby forming a trench region and defining at least one active region. An insulation material layer filling the trench region is formed on an entire surface of semiconductor substrate where the trench region is formed. The insulation material layer is planarization-etched, thereby exposing the CMP stopping layer 103 on the active regions and forming a device isolation layer 104 inside the trench region. It is desirable that the insulation material layer be planarization-etched using a CMP.

As a result, the isolation device layer 104 filled with the insulation material layer inside the trench region is formed, and the tunnel oxide layer 101, the lower floating gate pattern 102 and the CMP stopping layer pattern 103 sequentially deposited on the active regions are formed. The insulation material layer is made of a CVD oxide layer, a thermal oxide layer is formed in a sidewall and bottom of the trench region before forming the CVD oxide layer, thereby restoring the damage of the semiconductor substrate 100 which occurred while forming the trench region.

Figure 3:
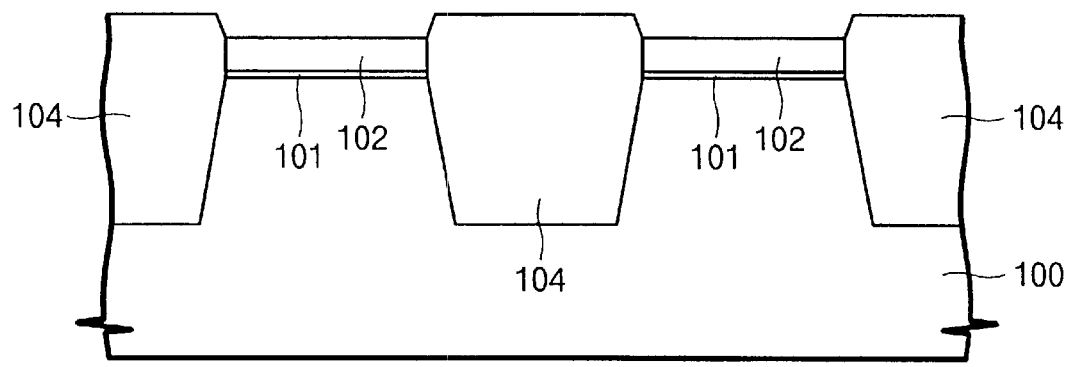
Figure 4:
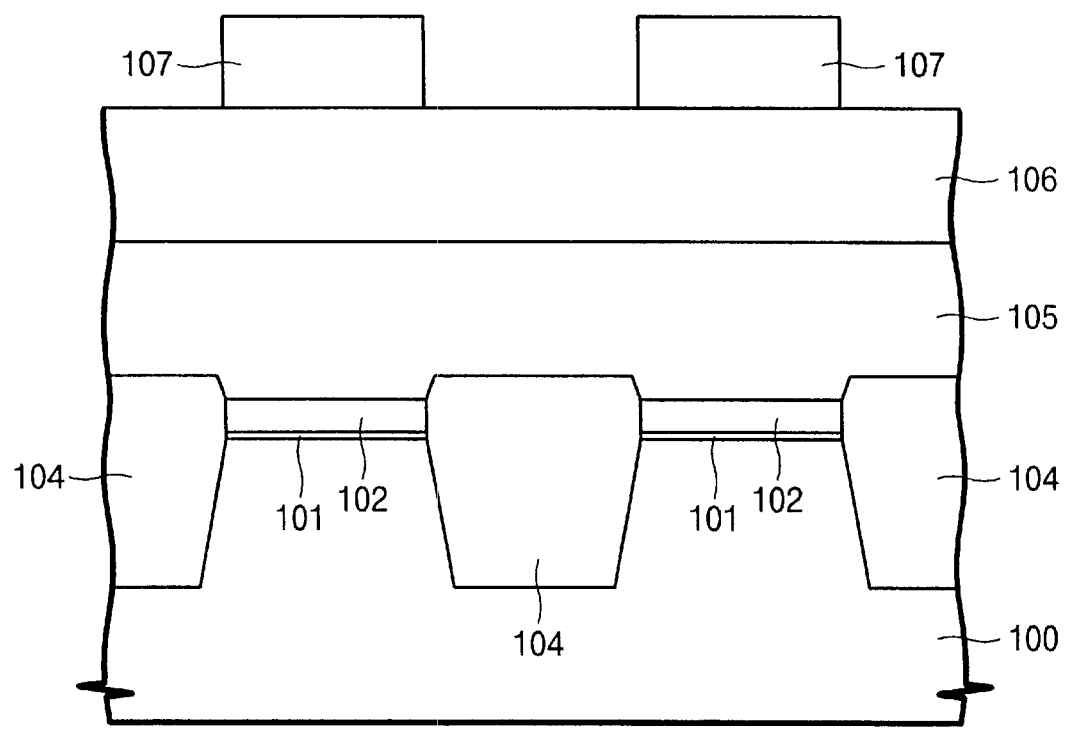

Referring to FIGS. 3 and 4, the CMP stopping layer 103 is removed, thereby exposing the lower floating gate pattern 102. Though not shown, the device isolation layer 104 is recessed to expose a sidewall of the lower floating gate pattern 102, in order to increase the size of the sidewall of a floating gate pattern to be formed in follow-up processes. When forming the CMP stopping layer pattern 103 using a silicon nitride layer, it is desirable that the CMP stopping layer pattern 103 be removed with anisotropical etching.

An upper floating gate layer 105 and a sacrificial insulation layer 106 are sequentially formed on an entire surface of a semiconductor substrate where the CMP stopping layer pattern 103 is removed. It is desirable that the upper floating gate layer 105 be made of a conductive material for example a doped polysilicon layer. It is desirable that the sacrificial insulation layer 106 be made of a layer having an etching selectivity for the upper floating gate layer 105, like a CVD oxide layer or a silicon nitride layer. Also, it is desirable that the sacrificial insulation layer 106 be formed with a thickness of 2,000 to 3,000 angstrom. If the lower floating gate pattern 102 is made of a non-doped polysilicon layer, an impurity is diffused to the lower floating gate pattern 102 in a process forming the upper floating gate layer 105, thereby conductivity is applied to the lower floating gate pattern 102. Subsequently, a photoresist pattern 107 covering the active regions is formed on an upper portion of the sacrificial insulation layer 106.

Figure 5:
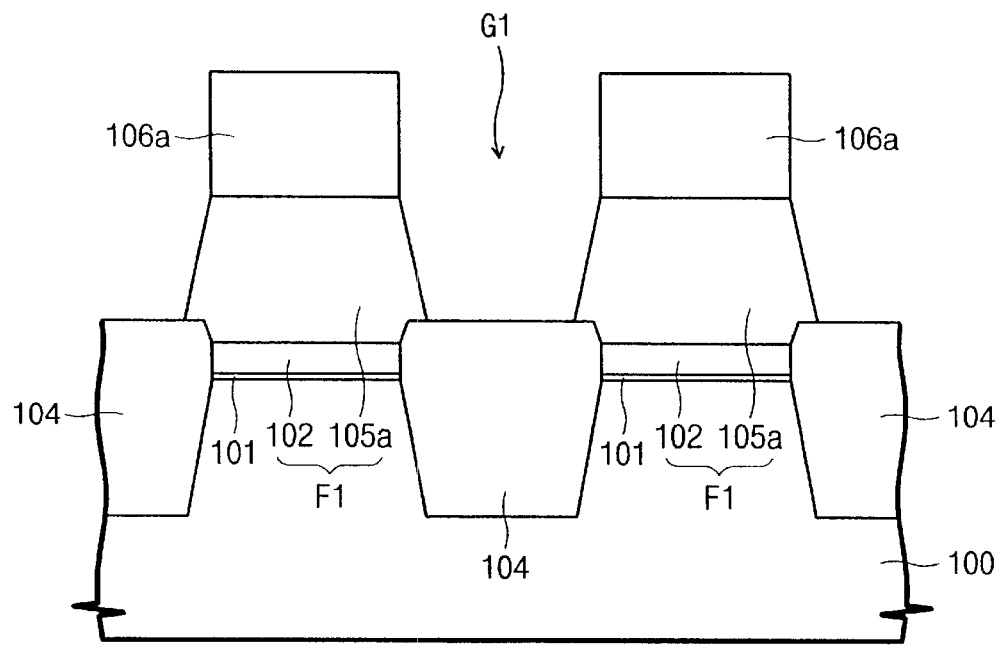

Referring to FIG. 5, the sacrificial insulation layer 106 is etched using the photoresist pattern 107 as an etching mask. Continuously, the upper floating gate layer 105 is etched using the photoresist pattern 107 as an etching mask, thereby exposing the device isolation layer 104 and forming an upper floating gate pattern 105a and a sacrificial insulation layer pattern 106a on the active regions. The upper floating gate layer 105 is etched using a chlorine-based etching gas. At this time, oxygen is flowed when performing etching, thereby gradually reducing an etching width of the upper floating gate layer 105 by a polymer generated with reaction with a carbon of a photoresist and inclining a sidewall of the upper floating gate pattern 105a. The inclined upper floating gate pattern 105 reduces an etching degree of a gate interlayer dielectric layer when patterning a gate electrode in follow-up processes.

Successively, the photoresist pattern 107 is removed. As a result, a floating gate pattern F1 and a sacrificial insulation layer pattern 106a covering the active region and having a gap region G1 on an upper portion of the device isolation layer between the active regions by being sequentially deposited on the semiconductor substrate are formed.

In another method, the sacrificial insulation layer 106 is etched using the photoresist pattern 107 as an etching mask, thereby forming a sacrificial insulation layer pattern 106a. Then, the photoresist pattern 107 is removed and the upper floating gate layer 105 is etched using the sacrificial insulation layer pattern 106a as etching mask, thereby exposing the device isolation layer 104 and forming the upper floating gate pattern 105 on the active regions. In this case, a sidewall of the upper floating gate pattern 105a formed on the active regions is vertically formed.

Figure 6:
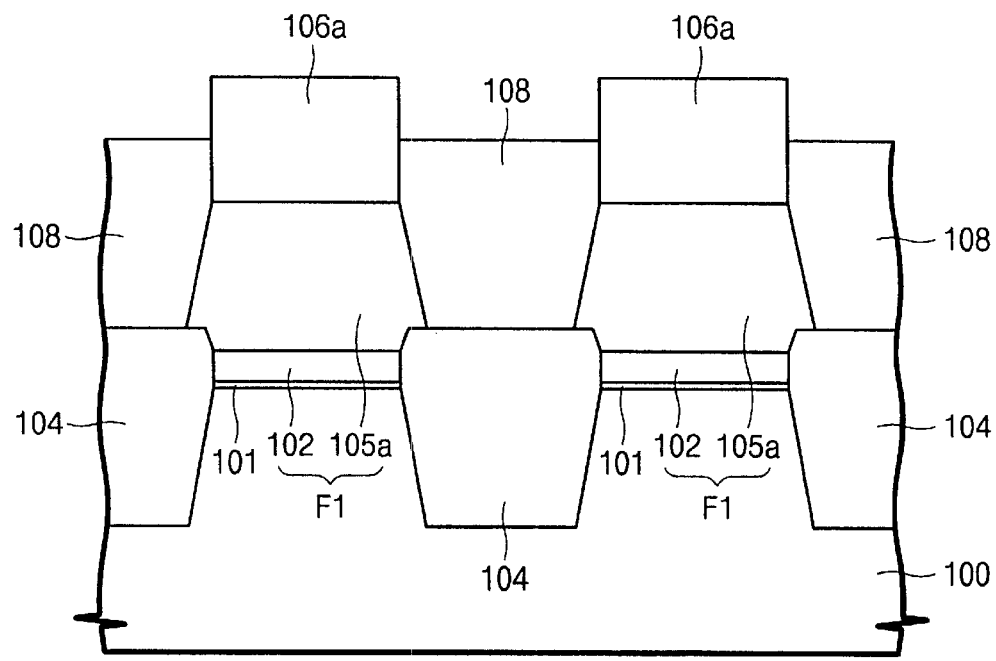

Referring to FIG. 6, a photosensitive layer filling the gap region G1 is formed on an entire surface of a semiconductor substrate where the floating gate pattern F1 and the sacrificial insulation layer pattern 106a are formed. An upper portion of the photosensitive layer is removed, thereby exposing an upper surface of the sacrificial insulation pattern 106a and forming a photosensitive layer pattern 108 inside the gap region G1. At this time, the upper portion of the photosensitive layer may be selectively removed by regulating the temperature of a bake process without passing an exposing process, after forming the photosensitive layer. That is, the upper portion of the photosensitive layer can be removed by being made to be easily dissolved in a developer for development. This is caused as an acid generated by heat disconnects a resin forming the photosensitive layer from an upper portion of the photosensitive layer, to regulate a bake temperature, thereby removing the photosensitive layer with a desired thickness.

Figure 7:
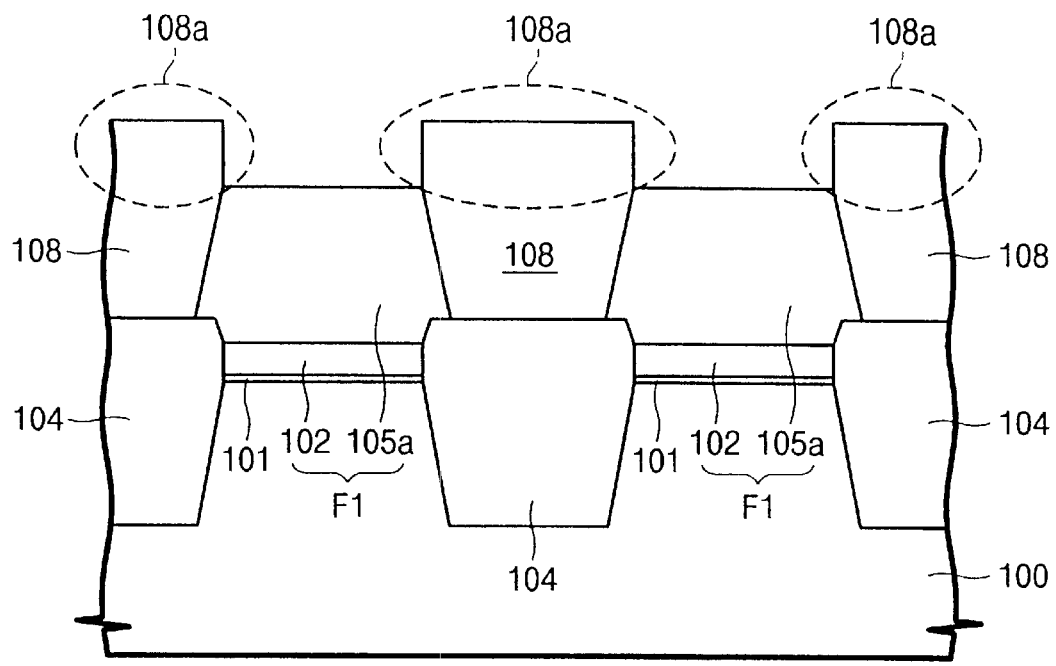

Referring to FIG. 7, the sacrificial insulation layer pattern 106a is removed, thereby exposing an upper surface of the floating gate pattern F1 on the active regions and exposing an upper sidewall of the photosensitive layer pattern 108 to have a projection 108a higher than the upper surface of the floating gate pattern F1 on the device isolation layer 104. It is desirable that the sacrificial insulation layer pattern 106a be removed using anisotropical etching.

Figure 8:
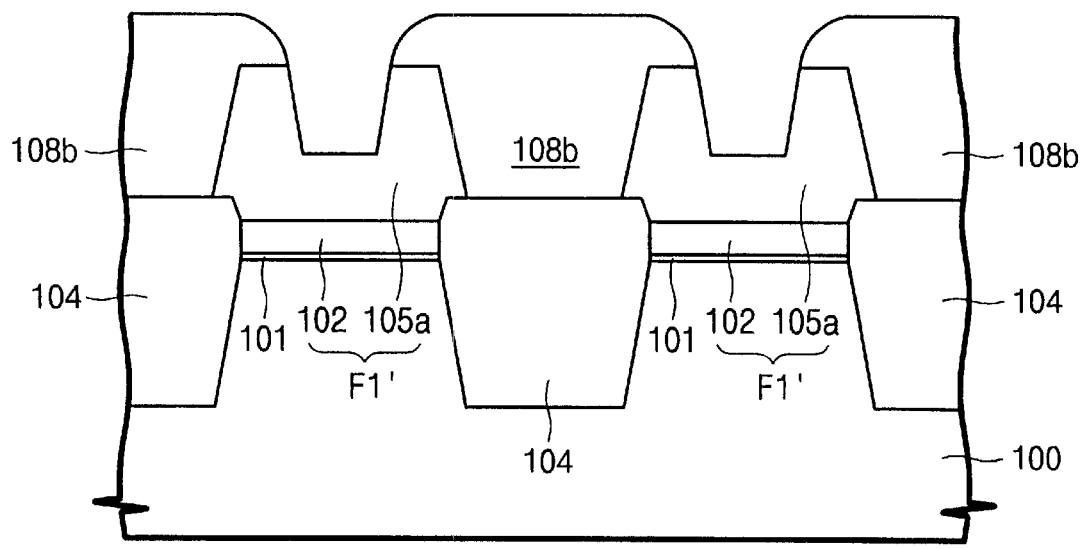

Referring to FIG. 8, the projection 108a is flowed to form a modified photosensitive layer pattern 108b covering an edge of the floating gate pattern F1 The floating gate pattern F1 is etched using the modified photosensitive layer pattern 108b as an etching mask, thereby forming a modified floating gate pattern F1' showing a U-shaped cross section on the active regions. It is desirable that the photosensitive layer is flowed in a bake process at a temperature of 130 to 150 degree C., for 50 to 200 seconds. Also, the etching amount of the floating gate pattern 107 is regulated to regulate a coupling ratio.

Figure 9:
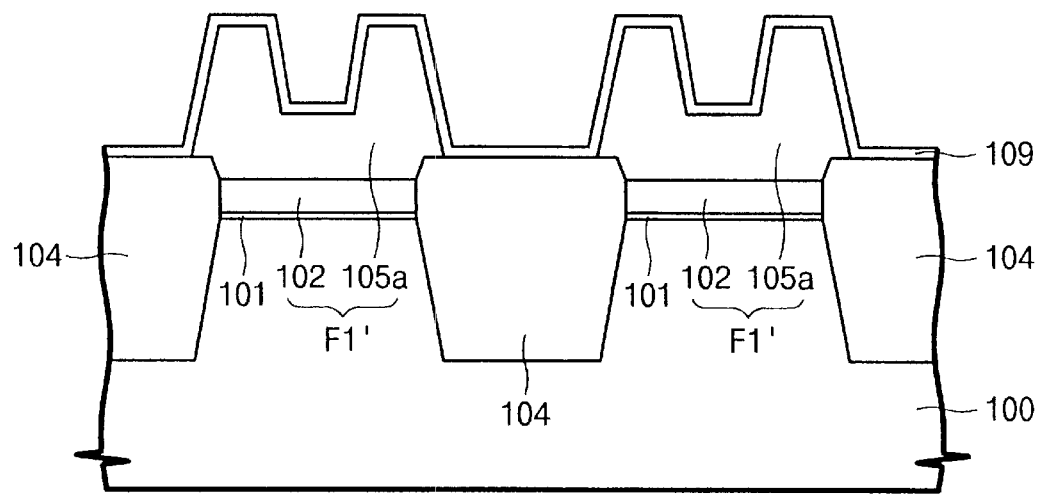

Referring to FIG. 9, the modified photosensitive layer pattern 108b is removed, thereby exposing an upper sidewall of the U-shaped floating gate pattern F1' and the device isolation layer 104. A gate interlayer dielectric layer 109 is formed on an entire surface of the semiconductor substrate where the modified floating gate pattern F1' and the device isolation layer 104 are exposed. It is desirable that the gate interlayer dielectric layer 109 be made of a material having a high permittivity like an oxide-nitride-oxide(ONO) layer. Also, it is desirable that a LPCVD be used to uniformly form the thickness of 100 to 200 angstrom.

Figure 10:
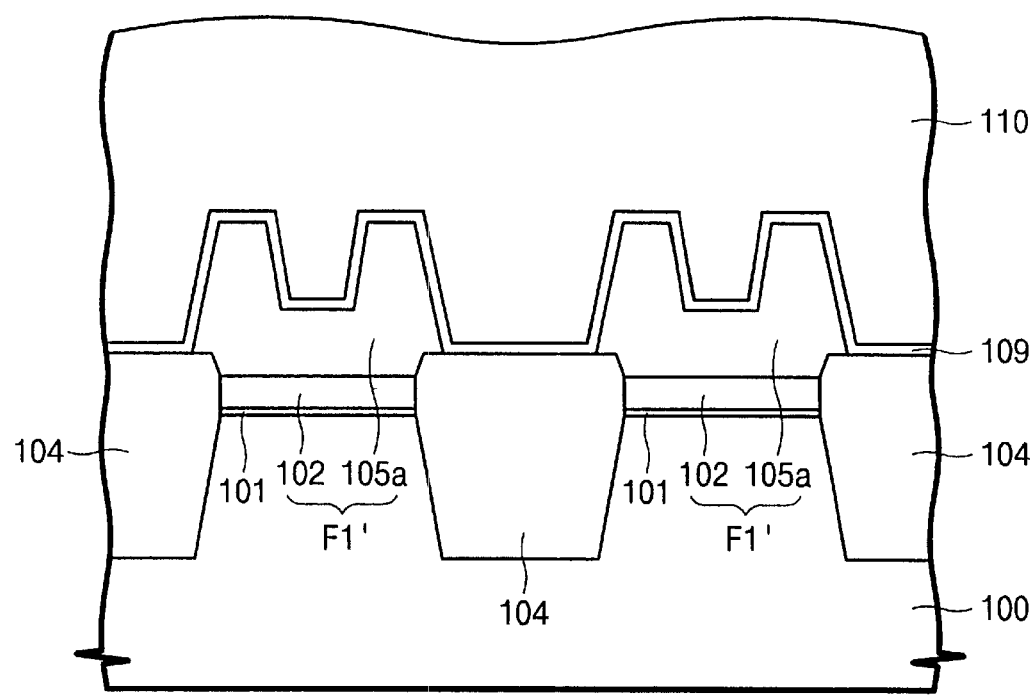

Referring to FIG. 10, a control gate electrode layer 110 is formed on an entire surface of a semiconductor substrate where the gate interlayer dielectric layer 109 is formed. It is desirable that the control gate electrode layer 110 be made of a doped polysilicon layer or a metal polycide layer. Also, a capping insulation layer may be formed on an upper portion of the control gate electrode layer 110.

Though not shown, the control gate electrode layer 110, the gate interlayer dielectric layer 109 and the modified floating gate pattern F1' are sequentially patterned, thereby forming a control gate electrode (9 of FIG. 1) crossing the active regions, and a floating gate (F of FIG. 1) between the control gate electrode (9 of FIG. 1) and the active regions.

Figure 11:
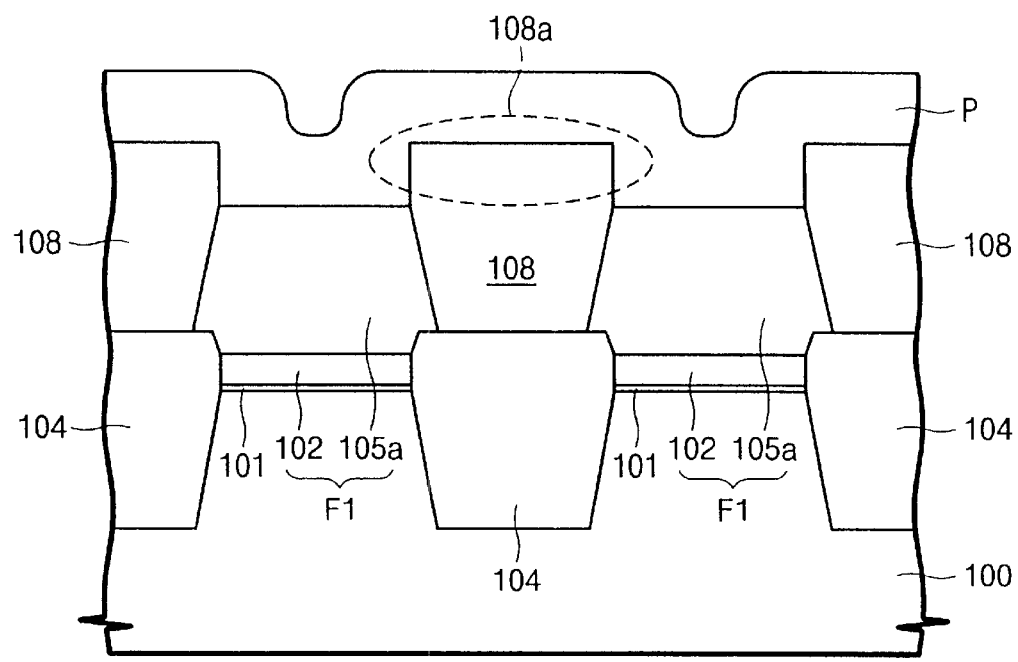
FIGS. 11 through 12 are process sectional views illustrating a method of forming a non-volatile memory device according to a second embodiment of the present invention, taken along line I–I' of FIG. 1.
Figure 12:
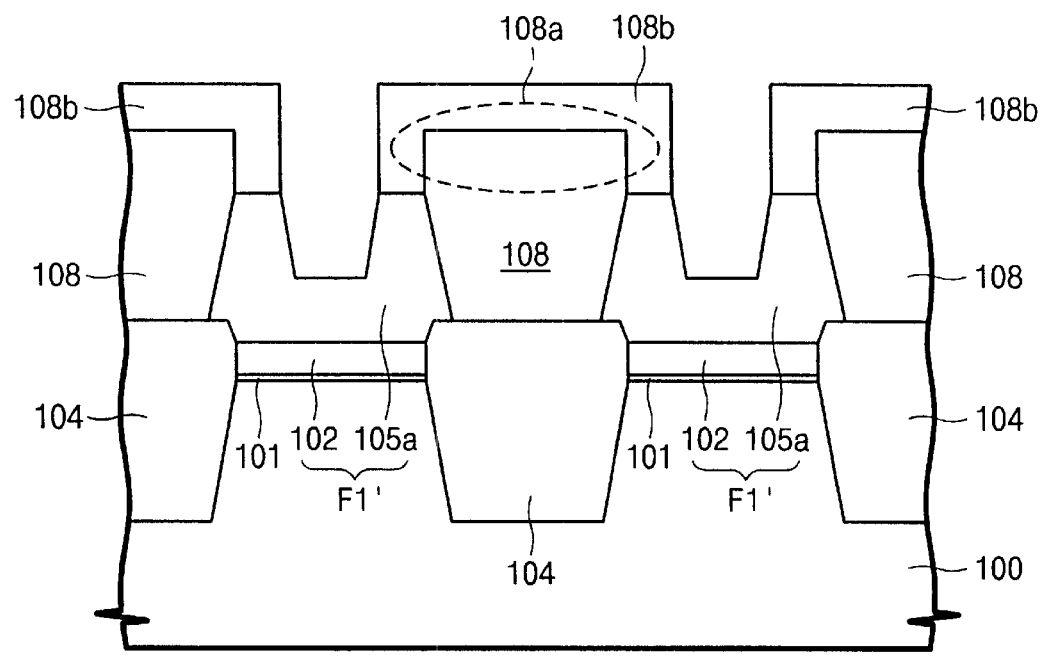

FIGS. 11 through 12 are process sectional views illustrating a second embodiment of the present invention. Here, steps up to formation of a photosensitive layer pattern having a projection on a semiconductor substrate are the same as the corresponding steps of FIGS. 2 through 7 illustrated in the first embodiment of the present invention.

Referring to FIG. 11, a polymer layer P is formed on an entire surface of a semiconductor substrate where the photosensitive layer pattern 108 having the projection 108a is formed. The polymer layer P should be a material layer which can be dissolved by deionized water used in a follow-up development step. For example, it is desirable to use polyvinyl alcohol, 2-prophenolic acid homopolymer, fluor-based watersoluble polymer, watersoluble polymer including fluoroalkyl ammonium salt, or urea-based watersoluble polymer.

Referring to FIG. 12, a bake process is applied to the semiconductor substrate 100 where the polymer layer P is formed at a temperature of 100 to 150 degree C., for 30 to 150 seconds, and a residual polymer layer P is removed using deionized water, thereby forming a polymer material layer 108b on a sidewall and upper portion of the projection 108a of the photosensitive pattern 108. When performing the bake, a crosslinking reaction is generated in a junction part of the photosensitive pattern 108 and the polymer layer P, and a crosslinking reaction is not generated in a junction part of the polymer layer P and the floating gate pattern F1 As a result, a polymer material layer 108b not dissolved in a deionized water only on the upper portion and sidewall of the projection 108a of the photosensitive pattern 108.

The floating gate pattern F1 is etched using the polymer material layer 108b and the photosensitive pattern 108 as an etching mask, thereby forming a modified floating gate pattern F1' having a U-shaped cross section on the active regions. Then, a control gate electrode and a floating gate are formed using a same manner as the first embodiment of the present invention.

Figure 13:
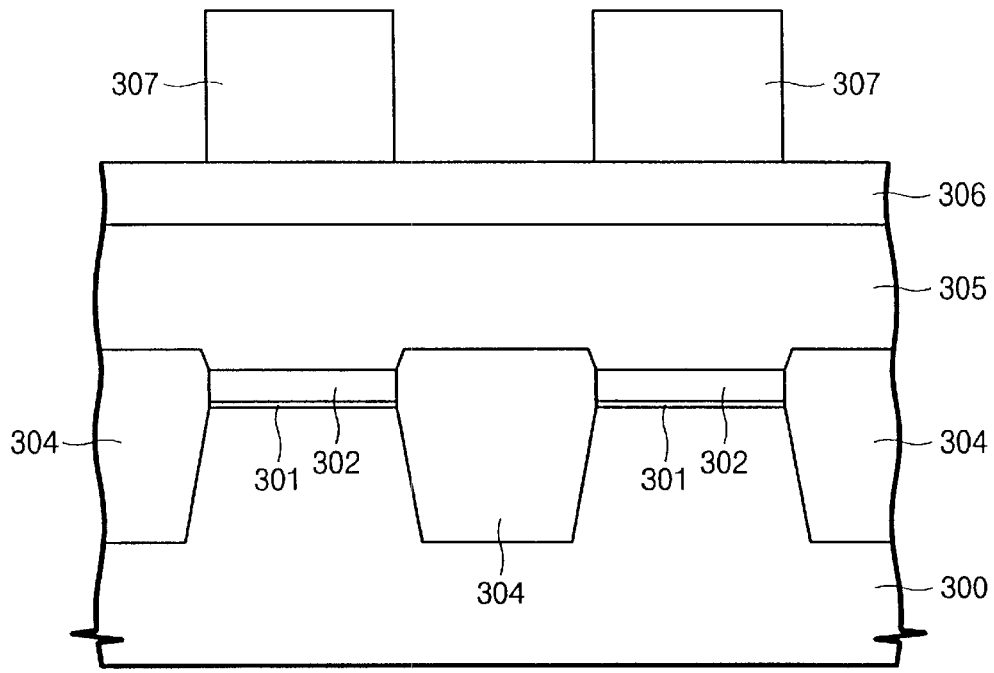
FIGS. 13 through 18 are process sectional views illustrating a method of forming a non-volatile memory device according to a third embodiment of the present invention, taken along line I–I' of FIG. 1.

FIGS. 13 through 18 are process sectional views for illustrating a third embodiment of the present invention. Referring to FIG. 13, a device isolation layer 304, a tunnel oxide layer 301, a lower floating gate pattern 302, an upper floating gate layer 305 and a hard mask layer 305 are sequentially formed on a semiconductor substrate 300 using a same manner as the first embodiment described above. It is desirable to use the hard mask layer 306 with a material layer having an etching selectivity for the upper floating gate layer 305, like a silicon nitride layer. Also, a photoresist pattern 307 is formed on an upper portion of the hard mask layer 306 on the active regions.

Figure 14:
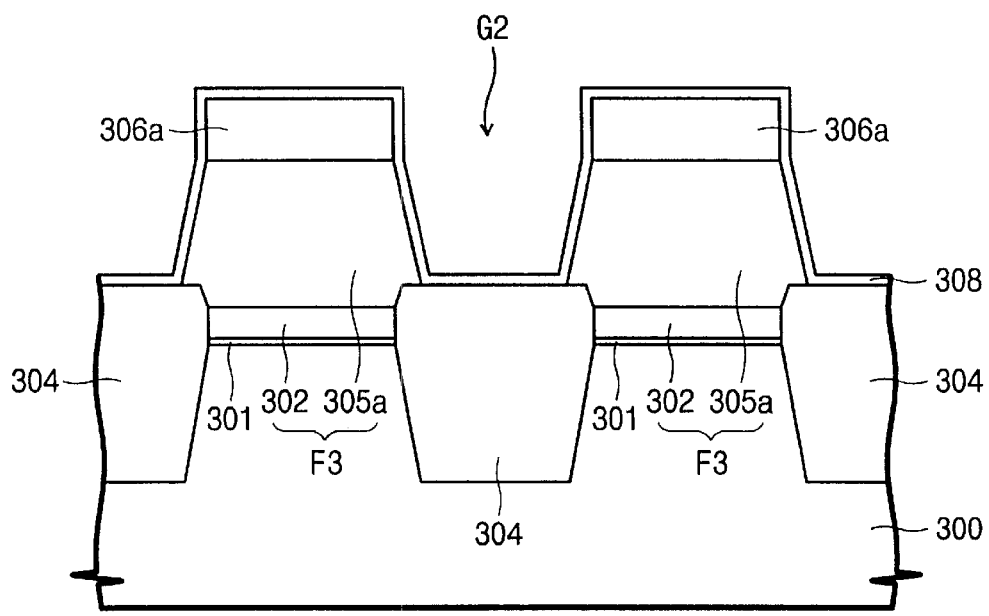

Referring to FIG. 14, the hard mask layer 306 and the upper floating gate layer 305 are successively patterned using the photoresist pattern 307 as an etching mask, thereby forming an upper floating gate pattern 305a and a hard mask pattern 306a sequentially deposited on the active regions are formed. As a result, a hard mask pattern 306 and a floating gate pattern F3 covering the active regions and having a gap region G2 on an upper portion of the device isolation layer between the active regions are formed by being sequentially deposited on the semiconductor substrate.

After removing the photoresist pattern 307, an etching stopping layer 308 is conformally formed on an entire surface of a semiconductor substrate where the hard disk pattern 306a and the floating gate pattern F3 are formed. It is desirable that the etching stopping layer 308 be made of a material layer having an etching selectivity for the device isolation layer 304 like a silicon nitride layer.

Figure 15:
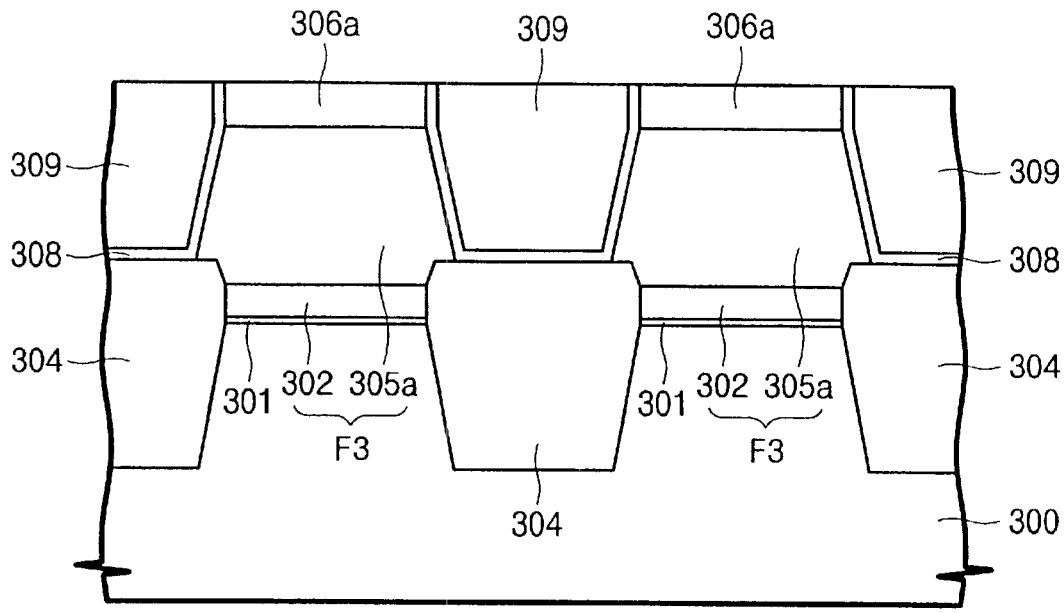

Referring to FIG. 15, an oxide layer filling the gap region G2 is formed on an entire surface of a semiconductor substrate where the etching stopping layer 308 is formed. It is desirable to form the oxide layer with a CVD oxide layer. The oxide layer is planarization-etched using an entire etching method, thereby exposing the hard mask pattern 306a and forming an oxide layer pattern 309 by leaving a part of the oxide layer inside the gap region G2. At this time, an upper surface of the hard mask pattern 306a is planarization-etched to a thickness of 100–200 angstrom.

Figure 16:
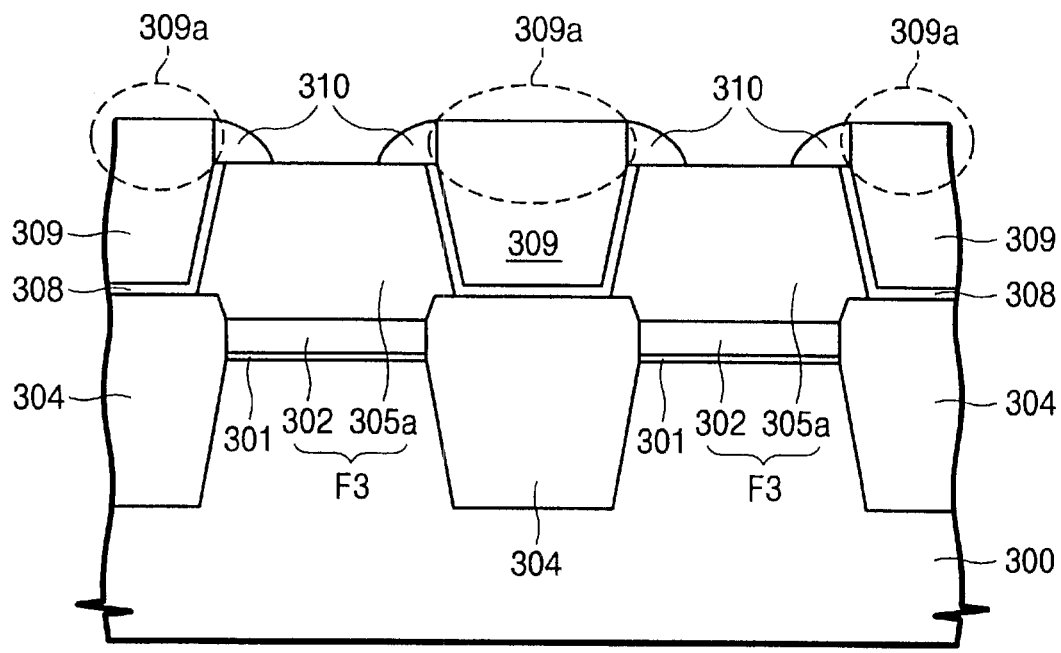

Referring to FIG. 16, the hard mask pattern 306a is removed, thereby exposing an upper surface of the floating gate pattern F13. Accordingly, the oxide layer pattern 309 has a projection 309a higher than the upper surface of the floating gate pattern F3. It is desirable to remove the hard mask pattern 306a using an anisotropic etching.

An insulation material is formed on an entire surface of a semiconductor substrate where the hard mask pattern 306a is removed. The insulation material is anisotropically etched, to form a spacer 310 covering an edge of an upper surface of the floating gate pattern F3 in a sidewall of the projection 309a of the oxide layer pattern 309. It is desirable to form the insulation material with a material layer having an etching selectivity for the floating gate pattern F3, like a CVD oxide layer or a silicon nitride layer.

Figure 17:
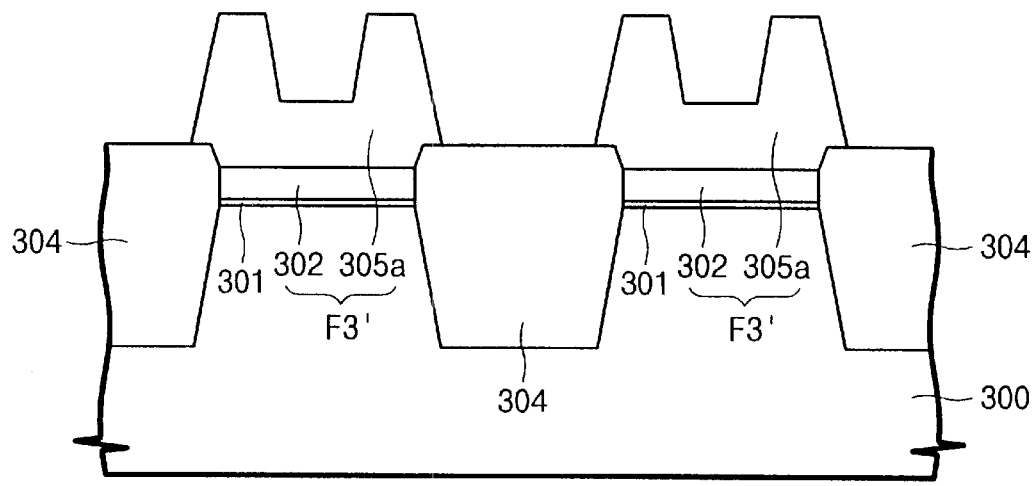

Referring to FIG. 17, the floating gate pattern F3 is etched using the oxide layer pattern 309 and the spacer 310 as an etching mask, thereby forming a modified floating gate pattern F3' having a U-shaped cross section on the active regions. The oxide layer pattern 309, the spacer 310 and the etching stopping layer 308 are removed, thereby exposing an upper portion and a sidewall of the modified floating gate pattern F3' and the device isolation layer 304.

When forming the spacer 310 with a CVD oxide layer, the spacer 310 and the oxide layer pattern 309 may be simultaneously removed. And when forming the spacer 310 with a silicon nitride layer, the spacer 310 may be removed in a step of removing the etching stopping layer 308. The etching stopping layer 308 prevents an over-etching of the device isolation layer 304 when removing the oxide layer pattern 309.

Figure 18:
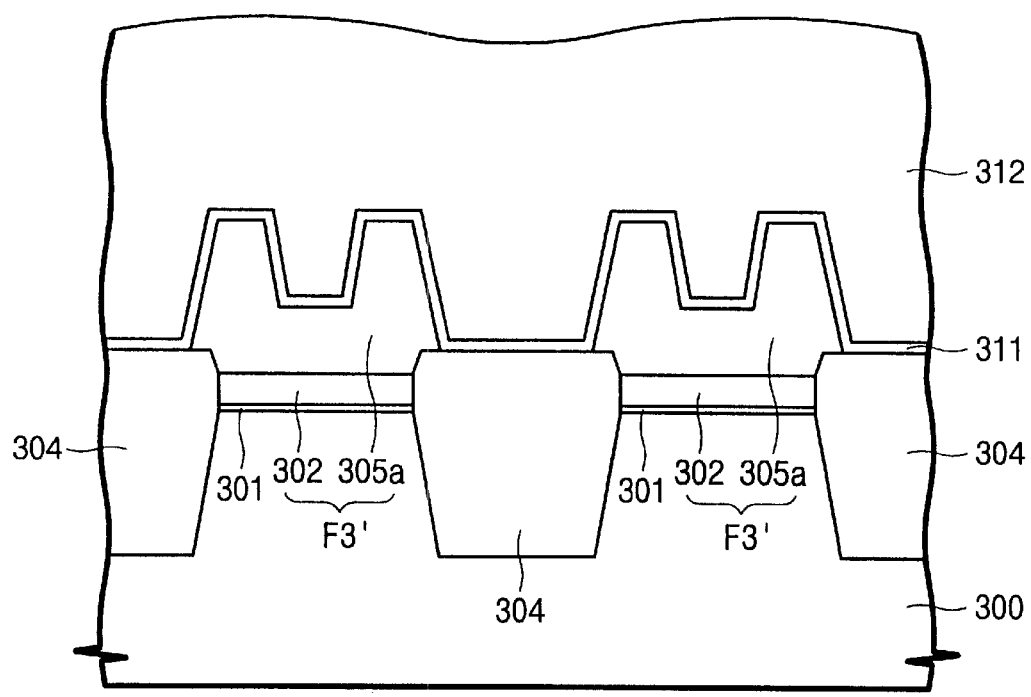

Referring to FIG. 18, a gate interlayer dielectric layer 311 is formed on an entire surface of a semiconductor substrate where the modified floating gate pattern F3' and the device isolation layer 304 are exposed. It is desirable to form the gate interlayer dielectric layer 311 with a material having a high permittivity such as an oxide-nitride-oxide (ONO) layer. Also, it is desirable to form the gate interlayer dielectric layer 311 using an LPCVD method for a uniform thickness of 100–200 angstrom.

A control gate electrode layer 312 is formed on an entire surface of a semiconductor substrate where the gate interlayer dielectric layer 311 is formed.

Though not shown, the control gate electrode layer 312, the gate interlayer dielectric layer 311 and the modified floating gate pattern F3' are sequentially patterned in the same manner as the first embodiment of the present invention, thereby forming a control gate electrode (9 of FIG. 1) crossing the active regions, and a floating gate (F of FIG. 1) between the control gate electrode and the active regions.

According to this invention, a U-shaped floating gate is formed without increase of a cell size, thereby maximizing an overlapped area of a floating gate and a control gate electrode. As a result, coupling ratio is increased and it is possible to fabricate a non-volatile memory device having: a low operating voltage and a fast operating characteristic.

In the drawings and specification, there has been disclosed a typical preferred embodiment of the invention and, although specific terms are employed, they are used in a generic and descriptive sense only and not for purpose of limitation, the scope of the invention being set forth in the following claims.

What is claimed is:

1. A method of fabricating a non-volatile memory device, comprising the steps of:
    forming a device isolation layer in a predetermined region of a semiconductor substrate to define active regions;
    forming a floating gate pattern covering each of the active regions, a gap region exposing the device isolation layer being formed between the active regions;
    forming an insulation material pattern filling each of the gap regions, the insulation material pattern having a projection higher than an upper surface of the floating gate pattern, the width of the projection being wider than the width of an upper portion of the gap region;
    etching the floating gate pattern using the insulation material pattern as an etching mask to form a modified floating gate pattern having a U-shaped cross section on the active regions; removing the insulation material pattern; and
    forming a gate interlayer dielectric layer and a control gate electrode layer on a surface of the semiconductor substrate in which the insulation material pattern is removed.

2. The method according to claim 1, wherein the step of forming the insulation material pattern comprises the steps of:
    forming a photosensitive pattern filling the gap region, the photosensitive pattern having a projection higher than an upper surface of the floating gate pattern; and flowing the photosensitive layer pattern to form a modified photosensitive layer pattern covering an edge of the floating gate pattern.

3. The method according to claim 2, wherein the modified photosensitive layer pattern is formed by flowing the photosensitive layer pattern through a bake at a temperature of 130 to 150 degree C., for 50 to 200 seconds.

4. The method according to claim 1, wherein the step of forming the insulation material pattern comprises the steps of:

forming a photosensitive layer pattern covering the gap region, the photosensitive layer pattern having a projection higher than an upper surface of the floating gate pattern; and forming a polymer material layer on an upper portion and sidewall of the projection.

5. The method according to claim 4, wherein the step of forming the polymer material layer comprises the steps of:

forming a water-soluble polymer layer on an entire surface of a semiconductor substrate in which the photosensitive layer pattern is formed;

baking the semiconductor substrate in which the water-soluble polymer layer is formed to apply a cross-linking reaction to a junction part of the water-soluble polymer layer and the photosensitive pattern; and dipping the baked semiconductor substrate in de-ionized water to remove a non-crosslinked water-soluble polymer layer while performing the bake process.

6. The method according to claim 5, wherein the water-soluble polymer layer is one of a water-soluble polymer and a urea-based water-soluble polymer, the water soluble polymer being selected from the group consisting of polyvinyl alcohol, 2-prophenolic acid homopolymer, fluor-based water-soluble polymer, and fluoroalkyl ammonium salt.

7. The method according to claim 5, wherein the bake is performed at a temperature of 110 to 150 degree C., for 30 to 150 seconds.

8. The method according to claim 1, wherein the step of forming the insulation material pattern comprises the steps of:

forming an oxide layer pattern having a projection higher than an upper surface of the floating gate pattern in the gap region; and forming a spacer in a sidewall of the projection.

9. The method according to claim 8, further comprising a step of forming an etching stopping layer on a sidewall and a bottom of the gap region, before forming the oxide layer pattern.

10. The method according to claim 8, wherein the spacer is made of one of an oxide layer and a nitride layer.

11. The method according to claim 1, further comprising the step of forming a stack gate pattern by patterning the control gate electrode layer, the gate interlayer dielectric layer and the modified floating gate pattern, wherein the stack gate pattern includes a control gate electrode crossing an upper part of the active regions, and a tunnel oxide layer, a floating gate and the gate interlayer dielectric layer sequentially stacked between the active regions and the control gate electrode.

12. A method of forming a non-volatile memory device, comprising the steps of:

forming a device isolation layer in a predetermined region of a semiconductor substrate to define at least one active region;

forming a floating gate pattern covering each of the active regions, the floating gate pattern having a gap region exposing portions of the device isolation layer between the floating gate patterns;

forming a photosensitive layer pattern filling the gap region, the photosensitive layer pattern having a projection higher than an upper surface of the floating gate pattern;

flowing the photosensitive layer pattern to form a modified photosensitive layer pattern covering an edge of the floating gate pattern;

etching the floating gate pattern using the modified photosensitive layer pattern as an etching mask to form a modified floating gate pattern having a U-shaped cross section on the active regions;

removing the modified photosensitive layer pattern; and forming a gate interlayer dielectric layer and a control gate electrode layer on a surface of the semiconductor substrate in which the modified photosensitive layer pattern is removed.

13. The method according to claim 12, wherein the steps of forming the floating gate pattern and forming the photosensitive layer pattern comprise the steps of:

simultaneously forming the device isolation layer on the semiconductor substrate and tunnel oxide and lower floating gate patterns on each active region defined by the device isolation layer;

forming an upper floating gate layer and a sacrificial insulation layer on a surface of a semiconductor substrate in which the lower floating gate pattern is formed;

patterning the upper floating gate layer and the sacrificial insulation layer to form sequentially stacked floating gate and sacrificial insulation layer patterns covering each of the active regions and having a gap region exposing the device isolation layer between the active regions;

forming a photosensitive layer on a surface of a semiconductor substrate in which the floating gate pattern and the sacrificial insulation layer pattern are formed;

removing an upper portion of the photosensitive layer to form a photosensitive layer pattern inside the gap region, simultaneously with exposing an upper surface of the sacrificial insulation layer pattern; and removing the sacrificial insulation layer pattern.

14. The method according to claim 13, wherein the lower floating gate pattern is made of polysilicon.

15. The method according to claim 13, wherein the upper floating gate layer is made of doped polysilicon.

16. The method according to claim 13, wherein the sacrificial insulation layer is made of one of silicon oxide and silicon nitride.

17. The method according to claim 12, wherein the modified photosensitive layer pattern is formed by flowing the photosensitive layer pattern through a bake at a temperature of 130 to 150 degree C., for 50 to 200 seconds.

18. The method according to claim 12, further comprising the step of sequentially patterning the control gate electrode layer, the gate interlayer dielectric layer and the modified floating gate pattern to form a stack gate pattern, wherein the stack gate pattern includes a control gate electrode crossing an upper portion of the active regions, and a tunnel oxide layer, a floating gate and the gate interlayer dielectric layer interposed between the control gate electrode and the active regions.

19. A method of fabricating a non-volatile memory device, comprising the steps of:

forming a device isolation layer in a predetermined region of a semiconductor substrate to define active regions;

forming a floating gate pattern covering the active regions, the floating gate pattern having a gap region exposing the device isolation layer between the active regions;

forming a photosensitive pattern filling the gap region, the photosensitive pattern having a projection higher than an upper surface of the floating gate pattern;

forming a polymer material layer on an upper portion and a sidewall of the projection;

etching the floating gate pattern using the polymer material layer as an etching mask to form a modified floating gate pattern having a U-shaped cross section on the active regions;

removing the polymer material layer and the photosensitive layer pattern; and forming a gate interlayer dielectric layer and a control gate electrode layer on an entire surface of the semiconductor substrate in which the polymer material layer and the photosensitive layer pattern are removed.

20. The method according to claim 19, wherein the steps of forming the floating gate pattern and forming the photosensitive layer pattern comprise the steps of:

simultaneously forming the device isolation layer on a semiconductor substrate and tunnel oxide and lower floating gate patterns on the active regions defined by the device isolation layer;

forming an upper floating gate layer and a sacrificial insulation layer on a surface of a semiconductor substrate in which the lower floating gate pattern is formed;

forming floating gate pattern and sacrificial insulation layer pattern sequentially covering each of the active regions and having a gap region exposing the device isolation layer between the active regions;

forming a photosensitive layer on a surface of a semiconductor substrate in which the floating gate pattern and the sacrificial insulation layer are formed;

removing an upper portion of the photosensitive layer to form a photosensitive layer pattern inside the gap region, an upper surface of the sacrificial insulation layer pattern being exposed; and removing the sacrificial insulation layer pattern.

21. The method according to claim 20, wherein the lower floating gate pattern is made of polysilicon.

22. The method according to claim 20, wherein the upper floating gate layer is made of doped polysilicon.

23. The method according to claim 20, the sacrificial insulation layer is made of one of silicon oxide and silicon nitride.

24. The method according to claim 19, wherein the step of forming the polymer material layer comprises the steps of:

forming a water-soluble polymer layer on a surface of a semiconductor substrate in which the photosensitive layer pattern is formed;

baking a semiconductor substrate in which the water-soluble polymer layer is formed to apply crosslinking reaction in a junction part of the water-soluble polymer and the photosensitive layer pattern; and dipping the baked semiconductor substrate into de-ionized water to remove a non-crosslinked water-soluble polymer while performing the bake process.

25. The method according to claim 24, wherein the water-soluble polymer layer is one of a urea-based water-soluble polymer, polyvinyl alcohol, 2-prophenolic acid homopolymer and a fluor-based water-soluble polymer including fluoroalkyl ammonium salt.

26. The method according to claim 24, wherein the bake is performed at a temperature of 110 to 150 degree C., for 30 to 150 seconds.

27. The method according to claim 19, further comprising a step of sequentially patterning the control gate electrode layer, the gate interlayer dielectric layer and the modified floating gate pattern to form a stack gate pattern, wherein the stack gate includes a control gate electrode crossing an upper portion of the active regions, and a tunnel oxide layer, a floating gate and the gate interlayer dielectric layer interposed between the active regions and the control gate electrode.

28. A method of fabricating a non-volatile memory device comprising the steps of:

forming a device isolation layer in a predetermined region of a semiconductor substrate to define active regions;

forming a floating gate pattern covering the active regions, the floating gate pattern having a gap region exposing a device isolation layer between the active regions;

forming an oxide layer pattern having a projection higher than an upper surface of the floating gate pattern in the gap region;

forming a spacer in a sidewall of the projection;

etching the floating gate pattern using the oxide layer pattern and the spacer as an etching mask to form a modified floating gate pattern having a U-shaped cross section on the active regions;

removing the oxide layer pattern and the spacer; and forming a gate interlayer dielectric layer and a control gate electrode layer on a surface of the semiconductor substrate in which the insulation material pattern is removed.

29. The method according to claim 28, wherein the steps of forming the floating gate pattern and the oxide layer pattern comprise the steps of:

simultaneously forming the device isolation layer on a semiconductor substrate and tunnel oxide and a lower floating gate patterns on each active regions defined by a device isolation layer;

forming an upper floating gate layer and a sacrificial insulation layer on a surface of a semiconductor substrate in which the lower floating gate pattern is formed;

forming floating gate pattern and sacrificial insulation layer pattern sequentially covering the active regions and having a gap region exposing the device isolation layer between the active regions;

forming an oxide layer filling the gap region on a surface of a semiconductor substrate in which the floating gate pattern and the sacrificial insulation layer pattern are formed;

etching the oxide layer using an entire etching method to form an oxide layer pattern inside the gap region, an upper surface of the sacrificial insulation layer pattern being exposed; and removing the sacrificial insulation layer pattern.

30. The method according to claim 29, wherein the lower floating gate pattern is made of polysilicon.

31. The method according to claim 29, wherein the upper floating gate layer is made of doped polysilicon.

32. The method according to claim 29, wherein the sacrificial insulation layer is made of silicon nitride.

33. The method according to claim 29, further comprising a step of forming an etching stopping layer in a sidewall and bottom of the gap regions, before forming the oxide layer.

34. The method according to claim 28, wherein the spacer is made of one of silicon oxide and silicon nitride.

35. (Amended) The method according to claim 28, further comprising a step of sequentially pattering the control gate electrode layer, the gate interlayer dielectric layer and the modified floating gate pattern to form a stack gate, wherein the stack gate pattern includes a control gate electrode crossing an upper portion of the active regions, and a tunnel oxide layer, a floating gate and the gate interlayer dielectric layer deposited between the active regions and the control gate electrode.

* * * * *